US006169808B1

(12) United States Patent
Kim

(10) Patent No.: US 6,169,808 B1
(45) Date of Patent: Jan. 2, 2001

(54) SIGNAL COMPRESSING CIRCUIT

(75) Inventor: Seong-Ryeol Kim, Kyeongsangbuk-Do (KR)

(73) Assignee: Hyundai Electronics Industries Co., Ltd., Kyoungki-Do (KR)

( * ) Notice: Under 35 U.S.C. 154(b), the term of this patent shall be extended for 0 days.

(21) Appl. No.: 09/037,175

(22) Filed: Mar. 9, 1998

(30) Foreign Application Priority Data

Sep. 6, 1997 (KR) .................................................. 97-46060

(51) Int. Cl.$^7$ ...................................................... H03G 3/00

(52) U.S. Cl. ............................ 381/107; 381/106; 333/14

(58) Field of Search ..................................... 381/104, 106, 381/107, 108; 330/278, 288; 333/14; 327/306

(56) References Cited

U.S. PATENT DOCUMENTS 5,432,389  7/1995  Bader et al. .

*Primary Examiner*—Vivian Chang

(57) ABSTRACT

The present invention relates to a signal compressing circuit which amplifies an input signal on a logarithmic scale in an appropriate range, and has a variable gain stage, an input signal detector, and an automatic level controlling circuit, the automatic level controlling circuit including: a first comparator for comparing the input signal to a first reference voltage, and generating a signal proportional to the difference between them; a second comparator for comparing the input signal to a second reference voltage, and generating a signal proportional to the difference between them; and a current mirror for generating a controlling current in proportion to the output signal of the first and second comparators, thus controlling the gain of the variable gain stage in two steps so as to generate stable output signals.

10 Claims, 5 Drawing Sheets

SIGNAL COMPRESSING CIRCUIT

BACKGROUND OF THE INVENTION

1. Field of the Invention

The present invention relates to a signal compressing circuit, specifically, a signal compressing circuit which is designed to expand the intensity range of input signals having a stable attenuation property.

2. Discussion of Related Art

A signal compressing circuit is a device for amplifying input signals, transferred from communication equipment that directly transmits voice signals, to produce an appropriate range of signal amplitudes.

The signal compressing circuit is generally not a linear amplifier but a non-linear amplifier that amplifies input signals according to a logarithmic scale. Since a voice transmission is limited by the signal amplitude and noise characteristic of transmission signals, a non-linear amplifier is needed to amplify input signals using gains differing according to the volume level of the signal.

Such a non-linear amplifier increases the gain at very low volume signals but reduces the gain at very high volumes so that weak signal components will not be lost in background and strong signals will not overload the system.

FIG. 1 is a block diagram of a conventional signal compressing circuit.

As shown in FIG. 1, an input signal IN is fed into a Variable gain stage 10 through resistance R1 and into a rectifying circuit 20 through resistance R2.

The rectifying circuit 20 generates rectified current and voltage, $I_{RECT}$ and $V_{RECT}$, in proportion to input signal IN. The rectified current $I_{RECT}$ is supplied to the variable gain stage 10 and the rectified voltage $V_{RECT}$ is applied to an automatic level controlling circuit 30.

The automatic level controlling circuit 30 generates a control current $I_{ALC}$ in proportion to rectified voltage $V_{RECT}$. Comparing the rectified voltage $V_{RECT}$ to a reference voltage $V_{ALC}$, the automatic level controlling circuit 30 generates a controlling current $I_{ALC}$ that is proportional to the difference between the rectified voltage $V_{RECT}$ and a reference voltage $V_{ALC}$. The control current $I_{ALC}$ is used to control the level of the rectified current $I_{RECT}$ transferred to the Variable gain stage 10.

The Variable gain stage 10 receives an input signal IN and a total current $I_T$, which is the sum of the rectified current $I_{RECT}$ and controlling current $I_{ALC}$. The gain of the Variable gain stage 10 is actually dependent on the level of the total current $I_T$.

FIG. 2 is a block diagram of a conventional automatic level controlling circuit as described above.

As shown in FIG. 2, the automatic level controlling circuit 30 comprises a comparator 31, for comparing the rectified voltage $V_{RECT}$ to a predetermined reference voltage $V_{ALC}$, and a current mirror 32 for converting the output voltage of the comparator 31 into current.

Comparator 31 does not generate an output voltage when the rectified voltage $V_{RECT}$ is lower than the reference voltage $V_{ALC}$, whereas it produces the output voltage when the former is higher than the latter.

The current mirror 32 generates the control current $I_{ALC}$, whose level varies according to the output voltage of comparator 31, controlling the gain of the above-described Variable gain stage 10. The gain of the Variable gain stage 10 is determined by the controlling current $I_{ALC}$, which needs to be high enough to produce low output even with high volume level of the input signal.

The automatic level controlling circuit of a conventional signal compressing circuit uses only one reference voltage to limit the gain. Thus the range of an input signal is so limited in producing output signals without distortion that effective attenuation of distortion cannot be attained with very high volume level inputs.

Also, since the range of supply voltage limits the maximum value of an output, distortion may unavoidably occurs beyond the range of the supply voltage when the level of an output, whose gain has been attenuated, exceeds the supply voltage.

To overcome this problem, the reference voltage of the automatic level controlling circuit might be greatly reduced, but this will limit the range of inputs having an optimized total harmonic distortion property, and deteriorate the signal compressing circuit's performance.

SUMMARY OF THE INVENTION

Accordingly, the present invention is directed to a signal compressing circuit that substantially obviates one or more of the problems due to limitations and disadvantages of the related art.

The object of the present invention are to solve the problem described above in creating a signal compressing circuit. This object is accomplished by expanding the range of inputs having an optimized, total harmonic distortion property.

Additional features and advantages of the invention will be set forth in the description which follows, and in part will be apparent from the description, or may be learned by practice of the invention. The object and other advantages of the invention will be realized and attained by the structure particularly pointed out in the written description and claims hereof as well as the appended drawings.

To achieve these and other advantages, and in accordance with the purpose of the present invention, as embodied and broadly described, a signal compressing circuit has: a detector for detecting an input signal, and generating a first detected signal in current and a second detected signal in voltage, the first and second detected signals being proportional to the input signal; and a variable gain stage for amplifying the input signal with the controlling signal and the gain value proportional to the first detected signal.

The automatic level controlling circuit includes: a first comparator for comparing the input signal to a first reference voltage, and generating a signal proportional to the difference between them; a second comparator for comparing the input signal to a second reference voltage, having a higher level than the first reference voltage, and generating a signal proportional to the difference between them; and a current mirror for generating a controlling current in proportion to the level of the output signal or the first and second comparators.

It is to be understood that both the foregoing general description and the following detailed description are exemplary and explanatory, and are intended to provide further explanation of the invention as claimed.

It is understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention, and are incorporated in and constitute a part of this specification, illustrate embodiments of the invention that together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
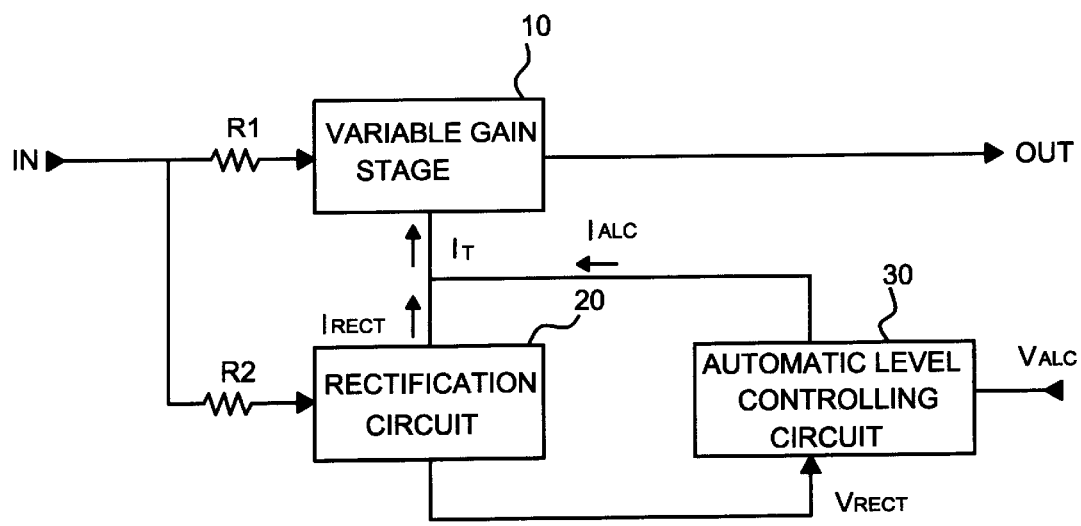
FIG. 1 is a block diagram of a conventional signal compressing circuit.
Figure 2:
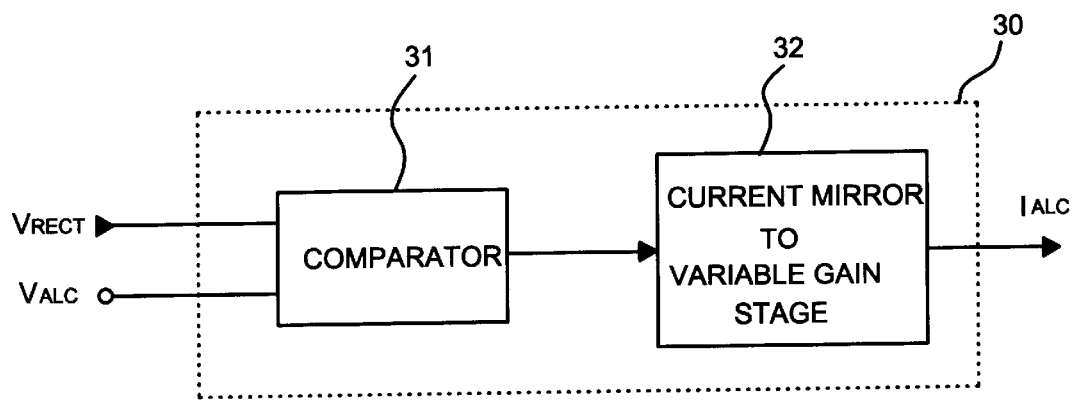
FIG. 2 is a block diagram of a conventional automatic level controlling circuit.
Figure 3:
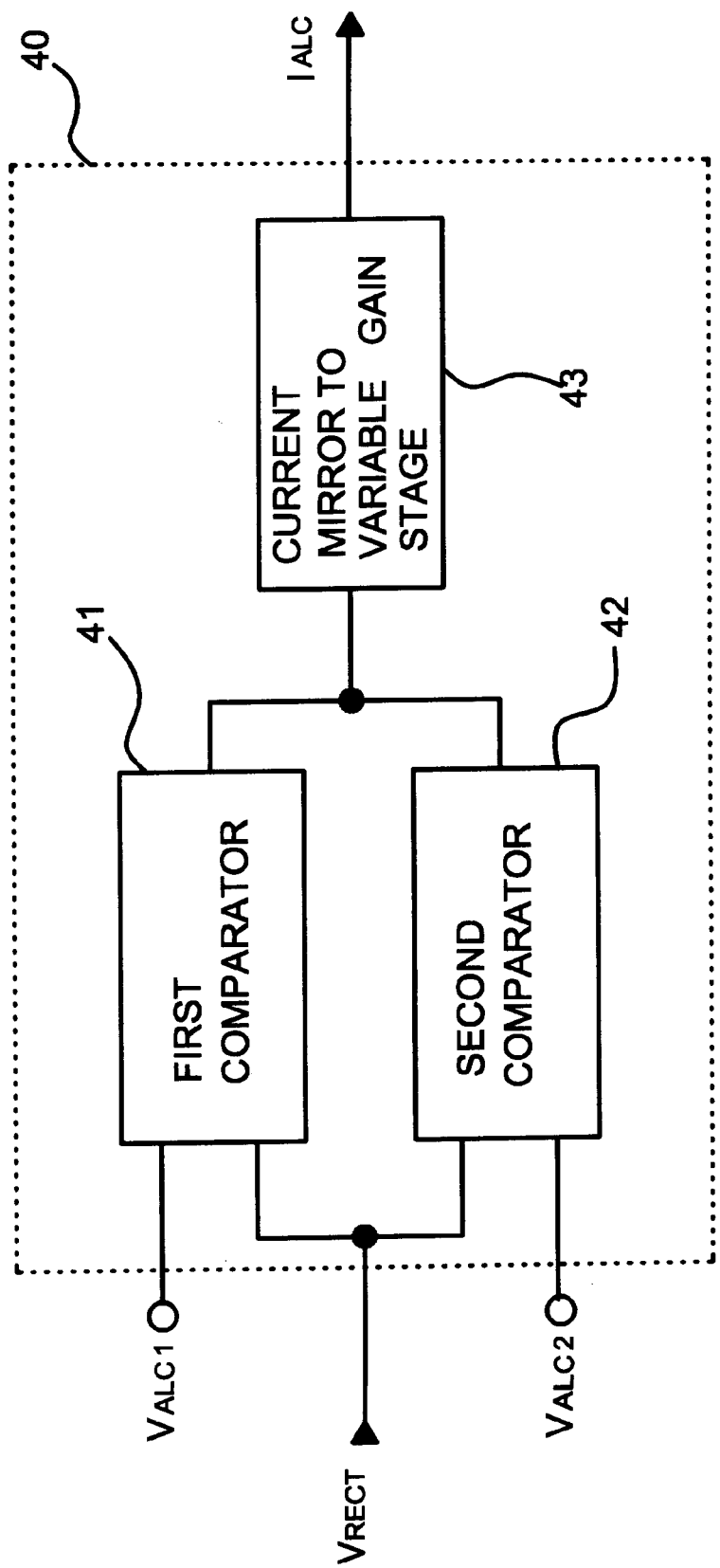
FIG. 3 is a block diagram of an automatic level controlling circuit in accordance with the present invention.

FIG. 3 is a block diagram of an automatic level controlling circuit in accordance with the present invention. FIG. 1 will also be referred to in explaining how the automatic level controlling circuit is connected to a Variable gain stage and a rectifying circuit.

As shown in FIG. 3, the automatic level controlling circuit 40 comprises two comparators 41 and 42, and one current mirror 43.

The reference voltage $V_{ALC1}$ for the first comparator 41 is lower than the reference voltage $V_{ALC2}$ of the second comparator 42. At a very high volume level from the input, the reference voltages $V_{ALC1}$ and $V_{ALC2}$ are used as the output control voltage, controlling the gain of Variable gain stage 10 so that the output is controlled to have an optimized, total harmonic distortion.

A change in the rectified voltage $V_{RECT}$ produces a proportional change in the volume level of input signal of the signal compressing circuit. When the rectified voltage $V_{RECT}$ exceeds the reference voltage $V_{ALC1}$, the first comparator 41 generates a control current $I_{ALC}$ between the current mirror 43 and the Variable gain stage 10, increasing the total current $I_T$ transferred to the Variable gain stage 10 and decreasing the gain of the Variable gain stage 10.

If the rectified voltage $V_{RECT}$ exceeds the reference voltage $V_{ALC2}$ of the second comparator 42, the control current $I_{ALC}$ is increased with the total current $I_T$ so that the gain of the Variable gain stage 10 will be further reduced.

Figure 4:
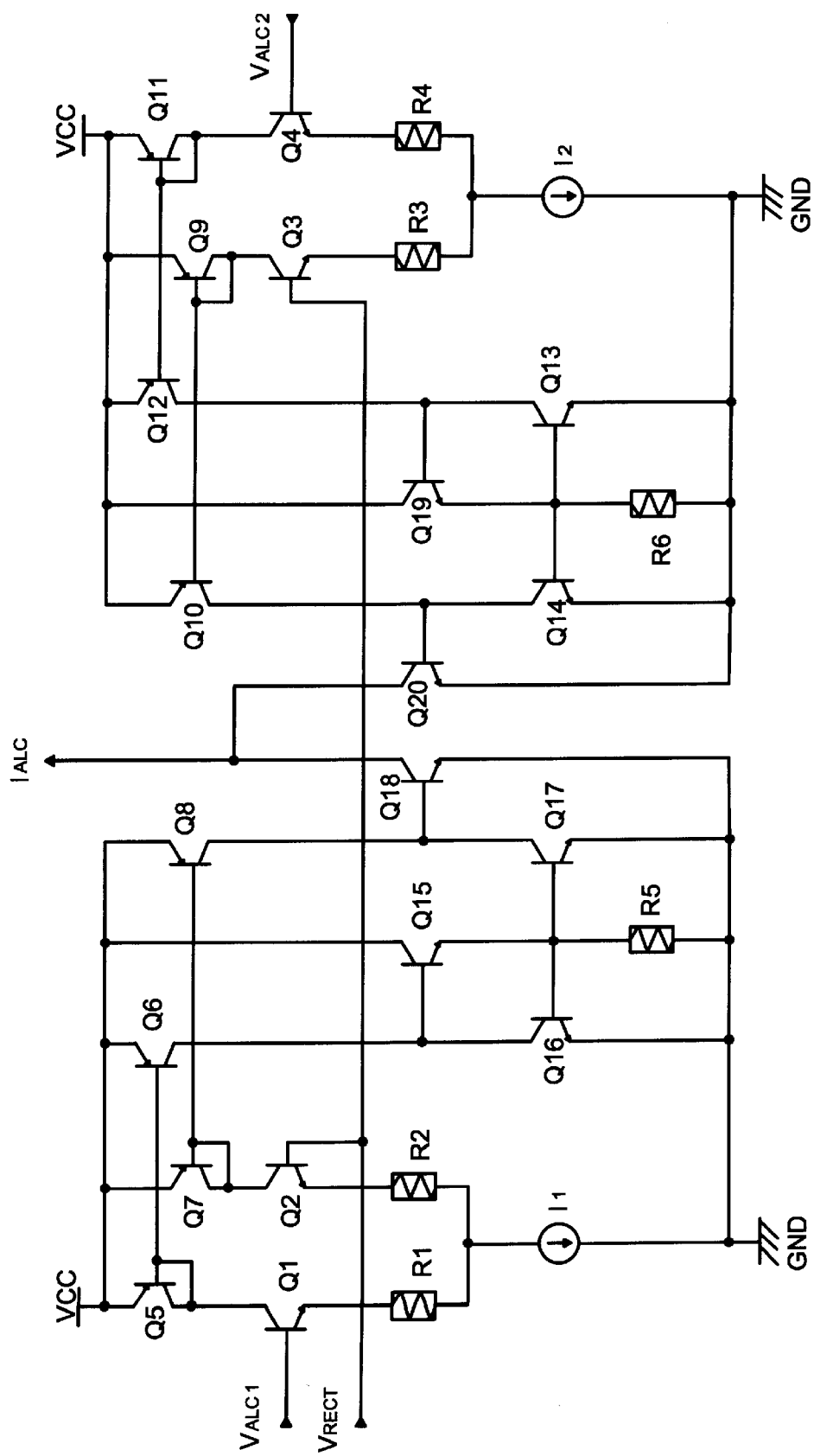
FIG. 4 is a detail circuit diagram of the automatic level controlling circuit in accordance with the present invention.

FIG. 4 is a detailed circuit diagram of the comparators and the current mirror of the automatic level controlling circuit 40 according to the present invention.

As shown in FIG. 4, the first comparator 41, which is a differential amplifier containing two bipolar transistors Q1 and Q2, receives the rectified voltage $V_{RECT}$ and the reference voltage $V_{ALC1}$ as differential signals, and four bipolar transistors Q5–Q8 function as active loads.

The bipolar transistor Q1 has reference voltage $V_{ALC1}$ applied to its base, one terminal of resistance R1 is applied to the emitter, and bipolar transistor Q5, as an active load, is connected at the collector.

The bipolar transistor Q5 is connected to the collector of the bipolar transistor Q1 with its base and collector short-circuited, and applied with a supply voltage $V_{CC}$ to its emitter.

The base of bipolar transistor Q6, functioning as an active load with bipolar transistor Q5, is connected to the base of bipolar transistor Q5 and applied with the supply voltage $V_{CC}$ at the emitter.

The bipolar transistor Q2 is applied with rectified voltage $V_{RECT}$ to its base, connected to one terminal of the resistance R2 with its emitter, and connected to the bipolar transistor Q7, which functions as an active load, with its collector.

The bipolar transistor Q7 is connected to the collector of the bipolar transistor Q2 with its base and collector short-circuited, and it is applied with a supply voltage $V_{CC}$ to its emitter.

The bipolar transistor Q8, functioning as an active load with bipolar transistor Q7, is connected to the base of the bipolar transistor Q7 with its base, and applied with the supply voltage $V_{CC}$ to its emitter.

The second comparator 42, which is also a differential amplifier, comprises two bipolar transistors Q3 and Q4 receiving the rectified voltage $V_{RECT}$ and the reference voltage $V_{ALC2}$ as differential signals, and four bipolar transistors Q9–Q12 that function as active loads.

The bipolar transistor Q4 has reference voltage $V_{ALC2}$ applied to its base, one terminal of the resistance R4 to its emitter, and bipolar transistor Q11, as an active load, to its collector.

The bipolar transistor Q11 has base and collector short-circuited and connected to the collector of the bipolar transistor Q4, and it is applied with the supply voltage $V_{CC}$ at the emitter.

The bipolar transistor Q12, functioning as an active load with the bipolar transistor Q11, has a base connected to the base of the bipolar transistor Q11, and an emitter applied with supply voltage $V_{CC}$ at the emitter.

The bipolar transistor Q3 has the rectified voltage $V_{RECT}$ connected to its base, one terminal of the resistance R3 at its emitter, and the bipolar transistor Q9, as an active load, at its collector.

The bipolar transistor Q9 has base and collector short-circuited and connected to the collector of the bipolar transistor Q3, and it is applied with a supply voltage $V_{CC}$ at the emitter.

The bipolar transistor Q10, functioning as an active load with the bipolar transistor Q9, has a base connected to the base of bipolar transistor Q9, and an emitter applied with supply voltage $V_{CC}$.

The current mirror 43 has a symmetric construction in the same manner of the two comparators 41 and 42.

Describing the current mirror 43 in more detail, the bipolar transistor Q15 has a collector applied with supply voltage $V_{CC}$, a base connected to the collector of the bipolar transistor Q6, and an emitter connected to a ground GND via the resistance R5.

The bipolar transistor Q16 is connected to the base of the bipolar transistor Q15 with its collector, to the ground GND with its base, and to the emitter of the bipolar transistor Q15 with its base.

The bipolar transistor Q17, functioning as a current transmitting circuit, is connected to the emitter of the bipolar transistor Q15 with its base, to the collector of the bipolar transistor Q8 with its collector, and to the ground GND with its emitter.

The bipolar transistor Q18 is connected to the collector of the bipolar transistor Q17 with its base and to ground GND with its emitter. The collector current becomes the controlling current $I_{ALC}$.

Symmetrically, the bipolar transistor Q19 has supply voltage $V_{CC}$ connected to its collector, the collector of the bipolar transistor Q12 to its base, and ground GND via resistance R6 to its emitter.

The bipolar transistor Q13 is connected to the base of the bipolar transistor Q19 with its collector, to the ground GND with its base, and to the emitter of the bipolar transistor Q19 with its base.

The bipolar transistor Q14, functioning as a current transmitting circuit, is connected to the emitter of the bipolar transistor Q19 with its base, to the collector of the bipolar transistor Q10 with its collector, and to ground GND with its emitter.

The bipolar transistor Q20 is connected to the collector of the bipolar transistor Q14 with its base and to the ground GND with its emitter. The collector current becomes the controlling current $I_{ALC}$.

The operation of the automatic level controlling circuit 40 according to the present invention is described in detail below.

When the level of rectified voltage $V_{RECT}$ applied to the first comparator 41 is increased to the level of reference voltage $V_{ALC1}$, each collector current of the two bipolar transistors Q1 and Q2 becomes zero according to the characteristic of a differential amplifier.

The collector currents of bipolar transistors Q16 and Q17 constituting the current mirror 43 goes to zero so that the collector current of bipolar transistor Q18 also falls to zero.

When the rectified voltage $V_{RECT}$ exceeds reference voltage $V_{ALC1}$, the bipolar transistor Q2 produces a collector current in proportion to the difference between the $V_{RECT}$ and $V_{ALC1}$.

Since the collector current of the bipolar transistor Q17 in the current mirror 43 is equivalent to that of the bipolar transistor Q2 in the comparator 41, a predetermined collector current occurs in the bipolar transistor Q18 whose base is controlled by the collector current of the bipolar transistor Q17.

The other comparator 42 operates in the same manner as the comparator 41 with the same construction. When the rectified voltage $V_{RECT}$ rises in excess of the reference voltage $V_{ALC2}$, the bipolar transistor Q20 produces a collector current.

The operation of the signal compressing circuit of the present invention will be described in detail as follows.

Figure 5:
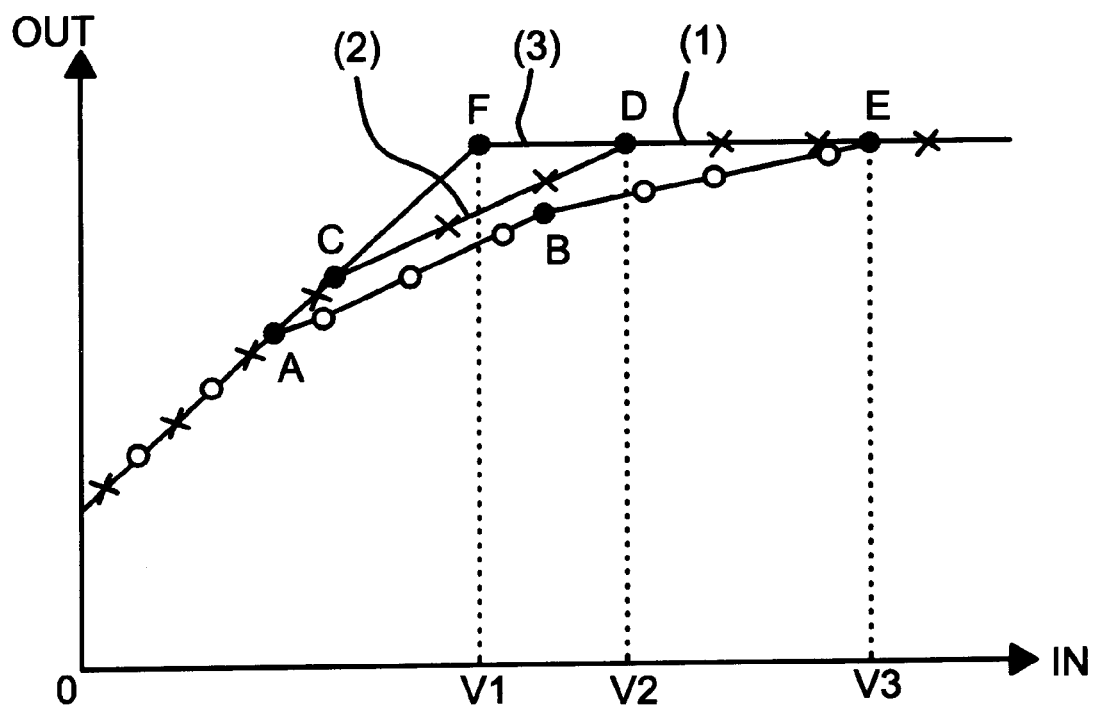
FIG. 5 is a graph showing the I/O characteristic of the automatic level controlling circuit in accordance with the present invention.

FIG. 5 is a graph showing the I/O characteristic of the signal compressing circuit.

Referring to FIG. 5, curve 1 indicates that two-stepped attenuation took place by means of two output control signals, that is, reference voltages $V_{ALC1}$ and $V_{ALC2}$. Curve 2 shows that one output controlling signal caused an attenuation, and curve 3 indicates that no attenuation occurred.

In Curve 1, the interval between two points A and B is an interval attenuated by reference voltage $V_{ALC1}$, and the interval between points B and E is an interval attenuated by the other reference voltage $V_{ALC2}$.

When the output OUT reaches the level of supply voltage $V_{CC}$, the level of input signal IN is V3 in curve 1, V2 in curve 2, and V1 in curve 3 (where, V1<V2<V3). As shown in FIG. 5, the input IN of an optimized, total harmonic distortion in curve 3 has the highest intensity range V3.

Figure 6A:
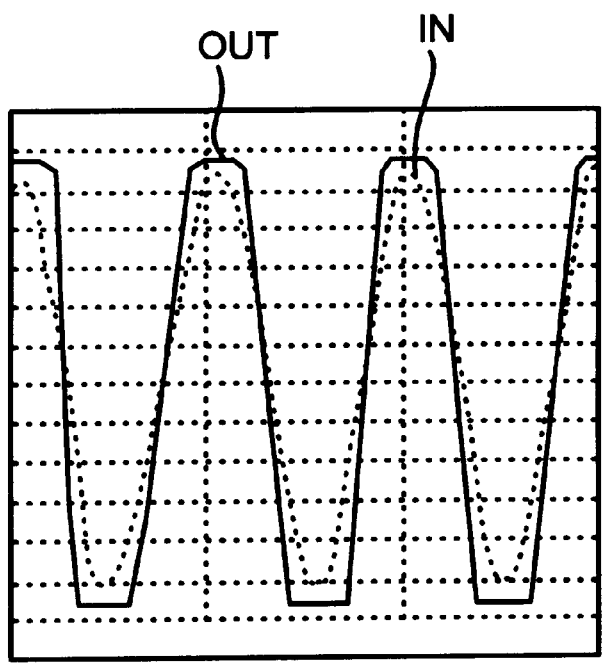
FIG. 6a is a waveform diagram showing the result of a simulation of the conventional signal compressing circuit.
Figure 6B:
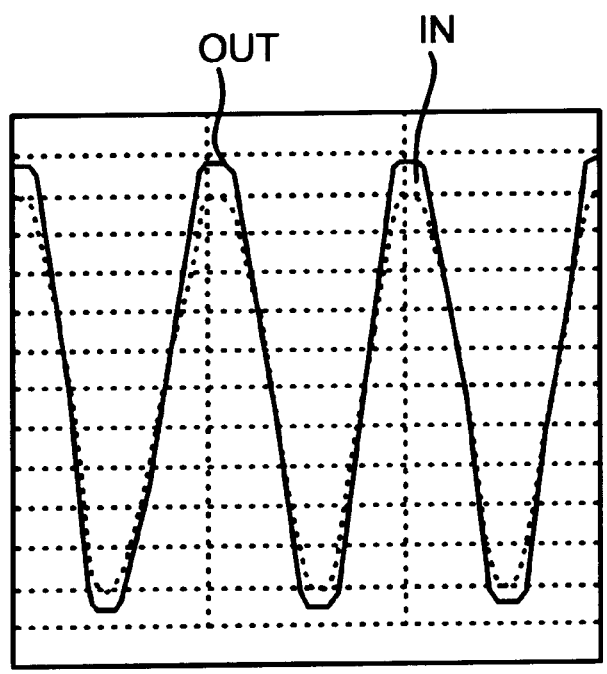
FIG. 6b is a waveform diagram showing the result of a simulation for the signal compressing circuit of the present invention.

FIGS. 6a and 6b are waveform diagrams to compare the results of a simulation for a conventional signal compressing circuit with that of a simulation of the present invention.

The peaks of output OUT are limited as to produce distorted signals in FIG. 6a, while a normal amplification is accomplished without a distortion by the present invention as shown in FIG. 6b.

As described above, the present invention expands the range of input which can have their total harmonic distortion optimized, and attains stable attenuation.

It will be apparent to those skilled in the art that various modifications and variations can be made in a signal compressing circuit of the present invention without departing from the spirit or scope of the invention. Thus, it is intended that the present invention cover the modifications and variations of this invention provided they come within the scope of the appended claims and their equivalents.

What is claimed is:

1. A signal compression circuit comprising:
    a means for detecting the level of an input signal, and generating a first detection signal in the current form proportional to the input signal, and a second detection signal in the voltage form;
    an automatic level controlling circuit for comparing the second detection signal to a predetermined reference voltage, and generating a controlling current in proportion to the difference between them; and
    a variable gain stage for amplifying the input signal with the gain proportional to the difference between the controlling signal and the first detection signal,
    the automatic level controlling circuit comprising:
        a first comparator for comparing a first reference voltage with the input signal, and generating a signal in proportion to the difference between them;
        a second comparator for comparing a second reference voltage, predetermined to be higher than the first reference voltage, with the input signal, and generating a signal in proportion to the difference between them; and
        a current mirror for generating the controlling current in proportion to the level of the output signal of the first and second comparators.

2. The signal compression circuit as claimed in claim 1, wherein the first reference voltage generates an output voltage having an optimized, total harmonic distortion property.

3. The signal compression circuit as claimed in claim 1, wherein the second reference voltage generates an output voltage having an optimized, total harmonic distortion property.

4. The signal compression circuit as claimed in claim 1, wherein the means rectifies the input signal, generating the rectified voltage and current of a predetermined level.

5. The signal compression circuit as claimed in claim 1, wherein the first detection signal is the rectified current generated by the rectification circuit.

6. The signal compression circuit as claimed in claim 1, wherein the second detection signal is the rectified voltage generated by the rectification circuit.

7. The signal compression circuit as claimed in claim 1, wherein the first comparator or the second comparator is a differential amplifier comprising an active load and receiving the first reference voltage or the second reference voltage, and the first detection signal as differential input signals.

8. The signal compression circuit as claimed in claim 7, wherein the first comparator comprises:

a first resistance;

a second resistance;

a first bipolar transistor Q1 receiving the first reference voltage with its base, and connected to one terminal of the first resistance with its emitter;

a second bipolar transistor receiving the second detection signal with its base, and connected to one terminal of the second resistance with its emitter;

a first constant-current source connected between the other terminals of the first and second resistances, and a ground;

a third bipolar transistor connected to the collector of the first bipolar transistor with its base and collector short-circuited, and applied with a supply voltage to its emitter;

a fourth bipolar transistor connected to the base of the third bipolar transistor with its base, and applied with the supply voltage to its emitter;

a fifth bipolar transistor connected to the collector of the second bipolar transistor with its base and collector short-circuited, and applied with the supply voltage to its emitter; and a sixth bipolar transistor connected to the base of the fifth bipolar transistor with its base, and applied with the supply voltage to its emitter.

9. The signal compression circuit as claimed in claim 7, wherein the second comparator comprises:

a third resistance;

a fourth resistance;

a seventh bipolar transistor receiving the second detection signal with its base, and connected to one terminal of the third resistance with its emitter;

an eighth bipolar transistor receiving the second reference voltage with its base, and connected to one terminal of the fourth resistance with its emitter;

a second constant-current source connected between the other terminals of the third and fourth resistances, and a ground;

a ninth bipolar transistor connected to the collector of the seventh bipolar transistor with its base and collector short-circuited, and applied with a supply voltage to its emitter;

a tenth bipolar transistor connected to the base of the ninth bipolar transistor with its base, and applied with the supply voltage to its emitter;

an eleventh bipolar transistor connected to the collector of the seventh bipolar transistor with its base and collector short-circuited, and applied with the supply voltage to its emitter; and a twelfth bipolar transistor connected to the base of the eleventh bipolar transistor with its base, and applied with the supply voltage to its emitter.

10. The signal compression circuit as claimed in claim 1, wherein the current mirror comprises:

a thirteenth bipolar transistor applied with the supply voltage to its collector, and connected to the collector of the fourth bipolar transistor with its base;

a fifth resistance connected between the emitter of the thirteenth bipolar transistor and the ground;

a fourteenth bipolar transistor connected to the base of the thirteenth bipolar transistor with its collector, to the ground with its emitter, and to the emitter of the thirteenth bipolar transistor with its base;

a fifteenth bipolar transistor connected to the emitter of the thirteenth bipolar transistor with its base, to the collector of the sixth bipolar transistor with its collector, and to the ground with its emitter;

a sixteenth bipolar transistor connected to the collector of the fifteenth bipolar transistor with its base, connected to the ground with its emitter, and generating the controlling current at its collector;

a seventeenth bipolar transistor applied with the supply voltage to its collector, and connected to the collector of the tenth bipolar transistor with its base;

a sixth resistance connected between the emitter of the seventeenth bipolar transistor and the ground;

an eighteenth bipolar transistor connected to the base of the seventeenth bipolar transistor with its collector, to the ground with its emitter, and to the emitter of the seventeenth bipolar transistor with its base;

a nineteenth bipolar transistor connected to the emitter of the seventeenth bipolar transistor with its base, to the collector of the twelfth bipolar transistor with its collector, and to the ground with its emitter; and a twentieth bipolar transistor connected to the collector of the nineteenth bipolar transistor with its base, connected to the ground with its emitter, and generating the controlling current at its collector.

* * * * *